(12) United States Patent
Imai (10) Patent No.: US 11,916,543 B2
(45) Date of Patent: Feb. 27, 2024

(54) ANALOG SWITCH CIRCUIT

(71) Applicants: Kabushiki Kaisha Toshiba, Tokyo (JP); Toshiba Electronic Devices & Storage Corporation, Tokyo (JP)

(72) Inventor: Shigeo Imai, Chiba Chiba (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/897,845

(22) Filed: Aug. 29, 2022

(65) Prior Publication Data
US 2023/0299761 A1 Sep. 21, 2023

(30) Foreign Application Priority Data
Mar. 15, 2022 (JP) ................. 2022-040740

(51) Int. Cl.
*H03K 17/06* (2006.01)
*H03K 17/16* (2006.01)

(52) U.S. Cl.
CPC ......... *H03K 17/063* (2013.01); *H03K 17/162* (2013.01); *H03K 2217/0018* (2013.01)

(58) Field of Classification Search
CPC ............... H03K 17/063; H03K 17/162; H03K 2217/0018; H03K 17/06; H03K 17/08122
See application file for complete search history.

(56) References Cited

U.S. PATENT DOCUMENTS

2004/0119522 A1* 6/2004 Tachibana ............ H03K 17/063
327/390
2020/0412317 A1 12/2020 Sakai

FOREIGN PATENT DOCUMENTS

JP 2021-005750 A 1/2021

* cited by examiner

*Primary Examiner* — Jung Kim
(74) *Attorney, Agent, or Firm* — Allen & Overy LLP

(57) ABSTRACT

An analog switch circuit of an embodiment includes a CMOS analog switch, a first gate drive circuit, and a second gate drive circuit, a gate operating withstand voltage of the CMOS analog switch being VGT, an enable signal and a control signal being inputted to the first gate drive circuit and the second gate drive circuit. Assuming that VGT<VSH≤ (2×VGT), in a case where the enable signal is 0, the second gate drive circuit outputs a signal of voltage (VSH/2) to a gate terminal of a PMOS when the control signal is 0, and the first gate drive circuit outputs a signal of voltage (VSH/2) to a gate terminal of an NMOS when the control signal is 1.

4 Claims, 10 Drawing Sheets

| VOLTAGE LEVEL(V_IN) OF INPUT SIGNAL BEFORE CONDUCTION IS ESTABLISHED | SWITCH ON (V_GN = VSH, V_GP = 0) | | SWITCH OFF (V_GN = 0, V_GP = VSH) | |
|---|---|---|---|---|
| | GATE-SOURCE VOLTAGE OF NMOS | GATE-SOURCE VOLTAGE OF PMOS | GATE-SOURCE VOLTAGE OF NMOS | GATE-SOURCE VOLTAGE OF PMOS |
| VSH | VSH/2 | −VSH/2 | −VSH | 0 |
| 0 | VSH/2 | −VSH/2 | 0 | VSH |

| WHEN SWITCH IS OFF (EN = 0) | CNT=0 | CNT=1 |
|---|---|---|
| NMOS GATE DRIVE CIRCUIT | V_GN = 0 (NORMAL OPERATION) | V_GN = VSH/2 (INCREASED FROM NORMAL VOLTAGE BY VSH/2) |
| PMOS GATE DRIVE CIRCUIT | V_GP = VSH/2 (REDUCED FROM NORMAL VOLTAGE BY VSH/2) | V_GP = VSH (NORMAL OPERATION) |
| KIND OF OFF | OFF1 | OFF2 |

FIG. 8

| VOLTAGE LEVEL(V_IN) OF INPUT SIGNAL BEFORE CONDUCTION IS ESTABLISHED | SWITCH ON (V_GN = VSH, V_GP = 0) | | SWITCH OFF (V_GN = VSH/2, V_GP = VSH) OR (V_GN = 0, V_GP = VSH/2) | |
|---|---|---|---|---|
| | GATE-SOURCE VOLTAGE OF NMOS | GATE-SOURCE VOLTAGE OF PMOS | GATE-SOURCE VOLTAGE OF NMOS | GATE-SOURCE VOLTAGE OF PMOS |
| VSH | VSH/2 | -VSH/2 | -VSH/2 | 0 |
| 0 | VSH/2 | -VSH/2 | 0 | VSH/2 |

ANALOG SWITCH CIRCUIT

CROSS-REFERENCE TO RELATED APPLICATIONS

This application is based upon and claims the benefit of priority from the prior Japanese Patent Application No. 2022-040740 filed in Japan on Mar. 15, 2022; the entire contents of which are incorporated herein by reference.

FIELD

An embodiment described herein relates generally to an analog switch circuit where an N-type MOSFET and a P-type MOSFET are arranged in parallel.

BACKGROUND

When an N-type MOSFET (hereinafter referred to as "NMOS") is used as an analog switch, there may be a case where a high voltage side of an input signal is distorted in an output signal. When a P-type MOSFET (hereinafter referred to as "PMOS") is used as an analog switch, there may be a case where a low voltage side of an input signal is distorted in an output signal. In view of the above, a CMOS analog switch has been conventionally used where a distortion of an output signal is reduced by arranging the NMOS and the PMOS in parallel.

Gate terminals of the NMOS and the PMOS are insulated from source terminals and drain terminals by oxide films. However, when a voltage higher than a gate withstand voltage is applied between the gate terminal and the source terminal, for example, the insulating oxide film may be broken. For this reason, the analog switch is used at a voltage equal to or lower than the gate withstand voltage.

For cases where an analog switch is used at a voltage higher than a general gate withstand voltage, transistors having a high gate withstand voltage are used. However, the transistors having a high gate withstand voltage increase costs.

DETAILED DESCRIPTION

An analog switch circuit of an embodiment includes: an analog switch including an N-type MOSFET and a P-type MOSFET each having a gate operating withstand voltage of VGT, a source terminal of the N-type MOSFET and a source terminal of the P-type MOSFET being connected with each other, a drain terminal of the N-type MOSFET and a drain terminal of the P-type MOSFET being connected with each other, the N-type MOSFET and the P-type MOSFET being arranged in parallel, each of a potential of the drain terminal of the N-type MOSFET and a potential of the drain terminal of the P-type MOSFET being (VSH/2) when a voltage higher than VGT and equal to or lower than (2×VGT) is assumed as VSH; a first gate drive circuit to which an enable signal and a control signal are inputted, the first gate drive circuit being connected to a gate terminal of the N-type MOSFET of the analog switch; and a second gate drive circuit to which the enable signal and the control signal are inputted, the second gate drive circuit being connected to a gate terminal of the P-type MOSFET of the analog switch. In a case where a logical value of the enable signal is 0, a voltage 0 or a voltage VSH is applied to the source terminal of the N-type MOSFET of the analog switch and to the source terminal of the P-type MOSFET of the analog switch according to whether a logical value of the control signal is 0 or 1, when the logical value of the control signal is 0, the first gate drive circuit outputs a signal of voltage 0 to the gate terminal of the N-type MOSFET, and the second gate drive circuit outputs a signal of voltage (VSH/2) to the gate terminal of the P-type MOSFET, and when the logical value of the control signal is 1, the first gate drive circuit outputs a signal of voltage (VSH/2) to the gate terminal of the N-type MOSFET, and the second gate drive circuit outputs a signal of voltage VSH to the gate terminal of the P-type MOSFET.

Figure 1:
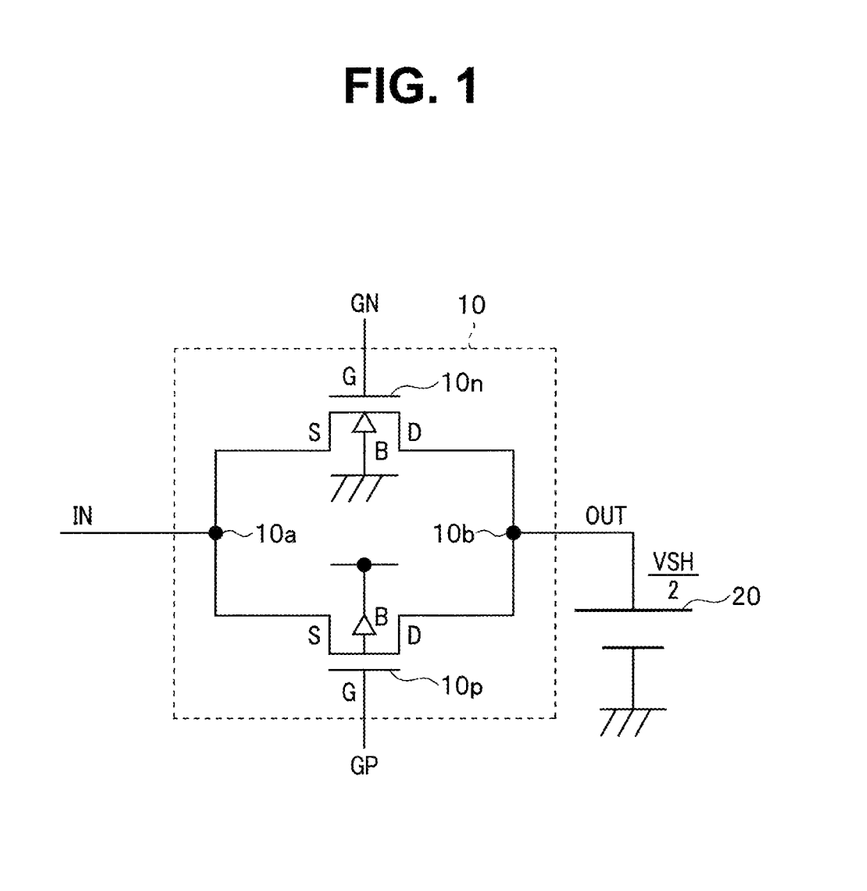
FIG. 1 is a diagram showing a configuration of a general analog switch.

Before the embodiment is specifically described, a configuration of the analog switch and the manner of operation of a comparison example will be described. FIG. 1 is a diagram showing a configuration of a general analog switch.

An analog switch 10 is a CMOS (complementary MOS) analog switch where an N-type MOSFET (N-type metal-oxide-semiconductor field-effect transistor) (hereinafter referred to as "NMOS") 10n and a P-type MOSFET (P-type metal-oxide-semiconductor field-effect transistor) (hereinafter referred to as "PMOS") 10p are connected in parallel.

A source terminal (S) of the NMOS 10n and a source terminal (S) of the PMOS 10p are connected with each other via an input terminal 10a of the analog switch 10. A drain terminal (D) of the NMOS 10n and a drain terminal (D) of the PMOS 10p are connected with each other via an output terminal 10b of the analog switch 10.

An analog input signal IN is inputted to the input terminal 10a. An analog output signal OUT is outputted from the output terminal 10b.

A gate drive signal GN is inputted to a gate terminal (G) of the NMOS 10n, and a gate drive signal GP is inputted to a gate terminal (G) of the PMOS 10p. Assume that each of a gate operating withstand voltage of the NMOS 10n and a gate operating withstand voltage of the PMOS 10p is VGT (units of voltage and potential are the Volt, for example, and the description of the unit is omitted hereinafter).

A back gate terminal (B) of the NMOS 10n is connected to the ground, and a back gate terminal (B) of the PMOS 10p is connected to a plus power supply. It is assumed that a voltage VSH is a voltage higher than VGT and equal to or lower than (2×VGT) [VGT<VSH≤(2×VGT)]. In this case, each of a back gate operating withstand voltage of the NMOS 10n and a back gate operating withstand voltage of the PMOS 10p is equal to or higher than the voltage VSH.

The output terminal 10b is connected to a power supply 20. The power supply 20 maintains a potential of the output terminal 10b at (VSH/2). Accordingly, each of a potential of the drain terminal (D) of the NMOS 10n and a potential of the drain terminal (D) of the PMOS 10p is (VSH/2).

Figure 2:
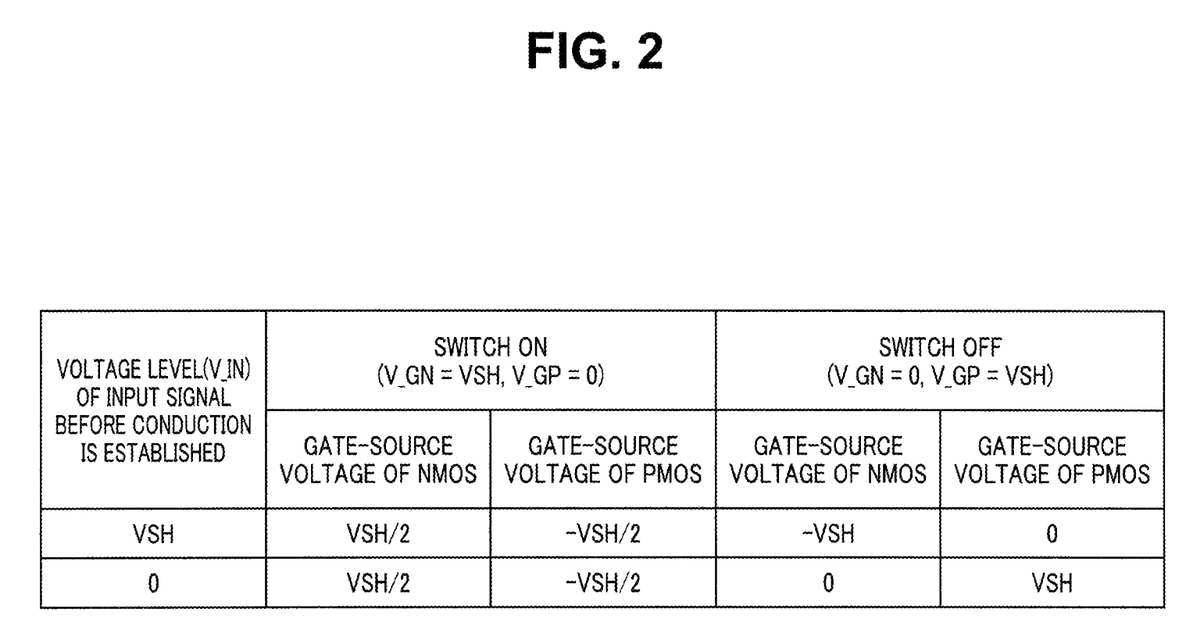
FIG. 2 is a table for describing the manner of operation of an analog switch according to a comparison example.

FIG. 2 is a table for describing the manner of operation of an analog switch 10 according to a comparison example.

A voltage V_IN of the input signal IN before the analog switch 10 is turned on (becomes conductive) is 0 or VSH.

When a gate drive signal GN of voltage V_GN=VSH is inputted to the gate terminal (G) of the NMOS 10n and a gate drive signal GP of voltage V_GP=0 is inputted to the gate terminal (G) of the PMOS 10p, the analog switch 10 is turned on.

When the analog switch 10 is turned on, the input terminal 10a and the output terminal 10b become conductive. Then, irrespective of whether the voltage V_IN of the input signal IN before the analog switch 10 is turned on (becomes conductive) is 0 or VSH, a potential of the input terminal 10a, that is, each of a potential of the source terminal (S) of the NMOS 10n and a potential of the source terminal (S) of the PMOS 10p becomes (VSH/2).

At this point of operation, the gate-source voltage of the NMOS 10n becomes (VSH/2), and the gate-source voltage of the PMOS 10p becomes (−VSH/2) (see a column for "switch on" in FIG. 2). (VSH/2) is larger than (VGT/2) and is equal to or smaller than VGT and hence, when the analog switch 10 is ON, a condition is satisfied that each of an absolute value of the gate-source voltage of the NMOS 10n and an absolute value of the gate-source voltage of the PMOS 10p is equal to or lower than a gate withstand voltage VGT.

In contrast, when a gate drive signal GN of voltage V_GN=0 is inputted to the gate terminal (G) of the NMOS 10n and a gate drive signal GP of voltage V_GP=VSH is inputted to the gate terminal (G) of the PMOS 10p, the analog switch 10 is turned off.

At this point of operation, when the voltage V_IN of the input signal IN is VSH, the gate-source voltage of the NMOS 10n becomes (−VSH), and the gate-source voltage of the PMOS 10p becomes 0. When the voltage V_IN of the input signal IN is 0, the gate-source voltage of the NMOS 10n becomes 0, and the gate-source voltage of the PMOS 10p becomes VSH (see a column for "switch off" in FIG. 2). Accordingly, when the analog switch 10 is OFF, either one of the absolute value of the gate-source voltage of the NMOS 10n or the absolute value of the gate-source voltage of the PMOS 10p becomes higher than the gate withstand voltage VGT.

The description will be made hereinafter with reference to drawings for the configuration of the embodiment where each of the gate-source voltage of the NMOS 10n and the gate-source voltage of the PMOS 10p is caused to become equal to or lower than the gate withstand voltage VGT irrespective of the analog switch 10 being OFF and of whether the voltage V_IN of the input signal IN is 0 or VSH.

First Embodiment

Configuration

Figure 3:
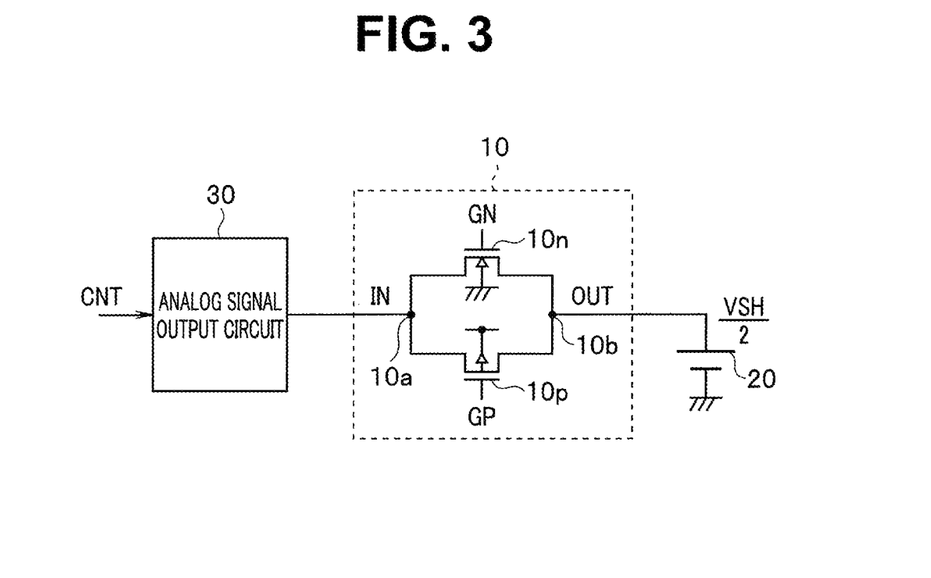
FIG. 3 is a diagram showing an example of a circuit configuration to which an analog switch circuit according to a first embodiment is applied.

FIG. 3 is a diagram showing an example of a circuit configuration to which an analog switch circuit 1 according to the first embodiment is applied.

An analog signal output circuit 30 receives an input of a control signal CNT, generates an analog input signal IN that corresponds to the control signal CNT, and outputs the generated input signal IN to the analog switch 10. The control signal CNT takes a logical value of "0" or "1". The analog signal output circuit 30 outputs an input signal IN of voltage V_IN=0 when CNT is 0. The analog signal output circuit 30 outputs an input signal IN of voltage V_IN=VSH when CNT is 1.

Figure 4:
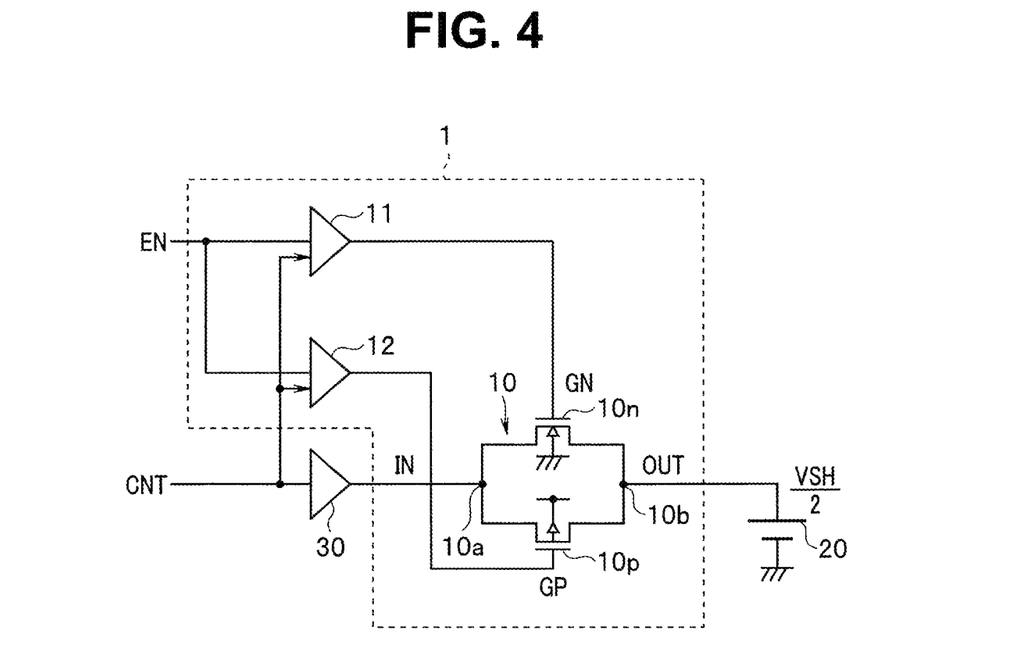
FIG. 4 is a diagram showing a configuration of the analog switch circuit according to the first embodiment.

FIG. 4 is a diagram showing a configuration of the analog switch circuit 1 according to the first embodiment.

The analog switch circuit 1 includes the analog switch 10, an NMOS gate drive circuit 11 (first gate drive circuit), and a PMOS gate drive circuit 12 (second gate drive circuit).

The NMOS gate drive circuit 11 is connected to the gate terminal (G) of the NMOS 10n of the analog switch 10. An enable signal EN and a control signal CNT are inputted to the NMOS gate drive circuit 11. The NMOS gate drive circuit 11 generate a gate drive signal GN of voltage V_GN that corresponds to the enable signal EN and the control signal CNT, and outputs the gate drive signal GN to the gate terminal (G) of the NMOS 10n.

The PMOS gate drive circuit 12 is connected to the gate terminal (G) of the PMOS 10p of the analog switch 10. The enable signal EN and the control signal CNT are inputted to the PMOS gate drive circuit 12. The PMOS gate drive circuit 12 generates a gate drive signal GP of voltage V_GP that corresponds to the enable signal EN and the control signal CNT, and outputs the gate drive signal GP to the gate terminal (G) of the PMOS 10p.

The enable signal EN takes a logical value of "0" or "1". When the enable signal EN takes the logical value of "0", the analog switch 10 is turned off. When the enable signal EN takes the logical value of "1", the analog switch 10 is turned on.

When the logical value of the enable signal EN is 0, the voltage V_IN of the input signal IN outputted from the analog signal output circuit 30 is applied to the source terminals (S) of the analog switch 10. The voltage V_IN applied to the source terminals (S) is 0 when the logical value of the control signal CNT is 0, and the voltage V_IN applied to the source terminals (S) is VSH when the logical value of the control signal CNT is 1.

(Manner of Operation)

Figure 5:
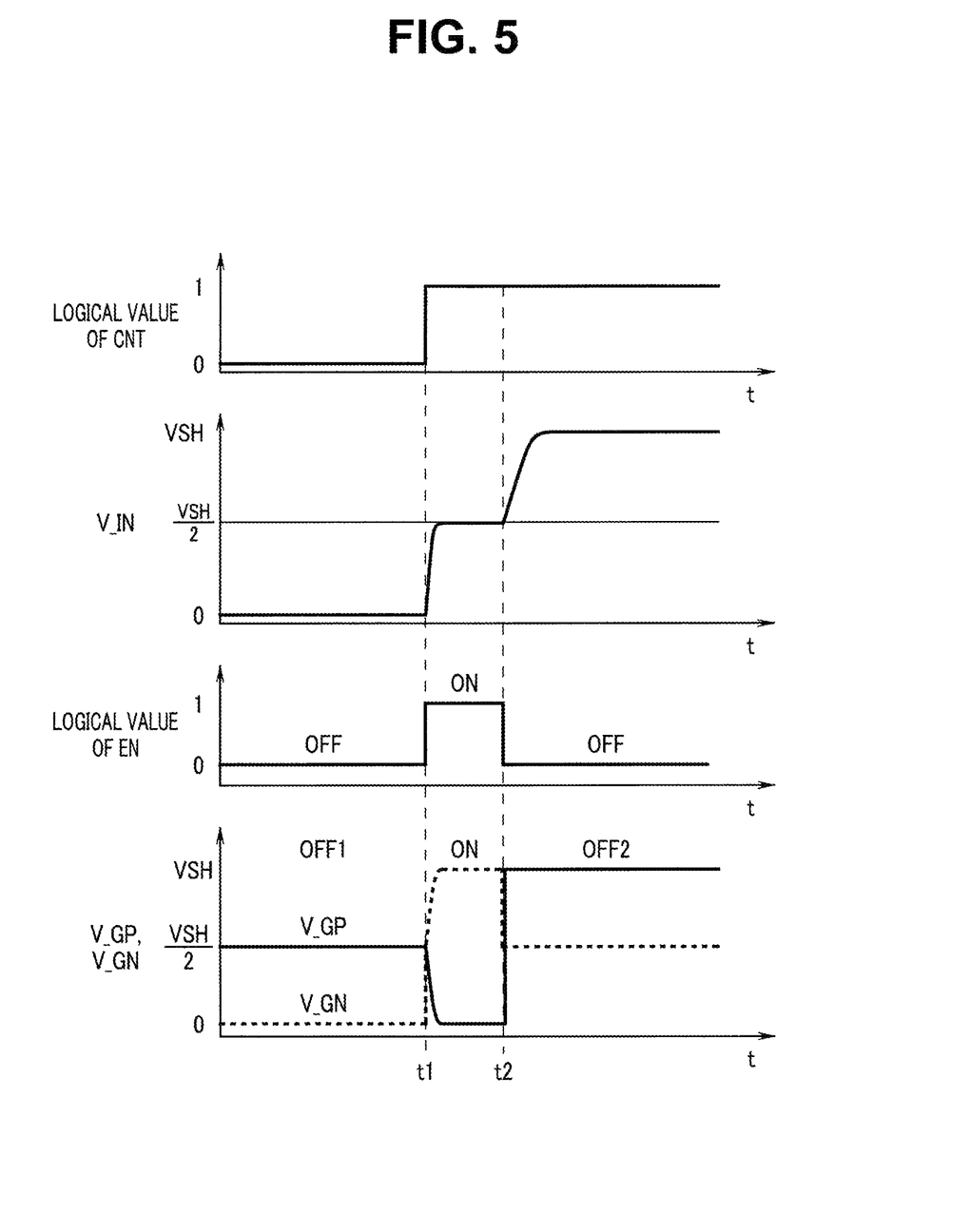
FIG. 5 is a timing chart showing a first operation example of the analog switch circuit according to the first embodiment.
Figure 6:
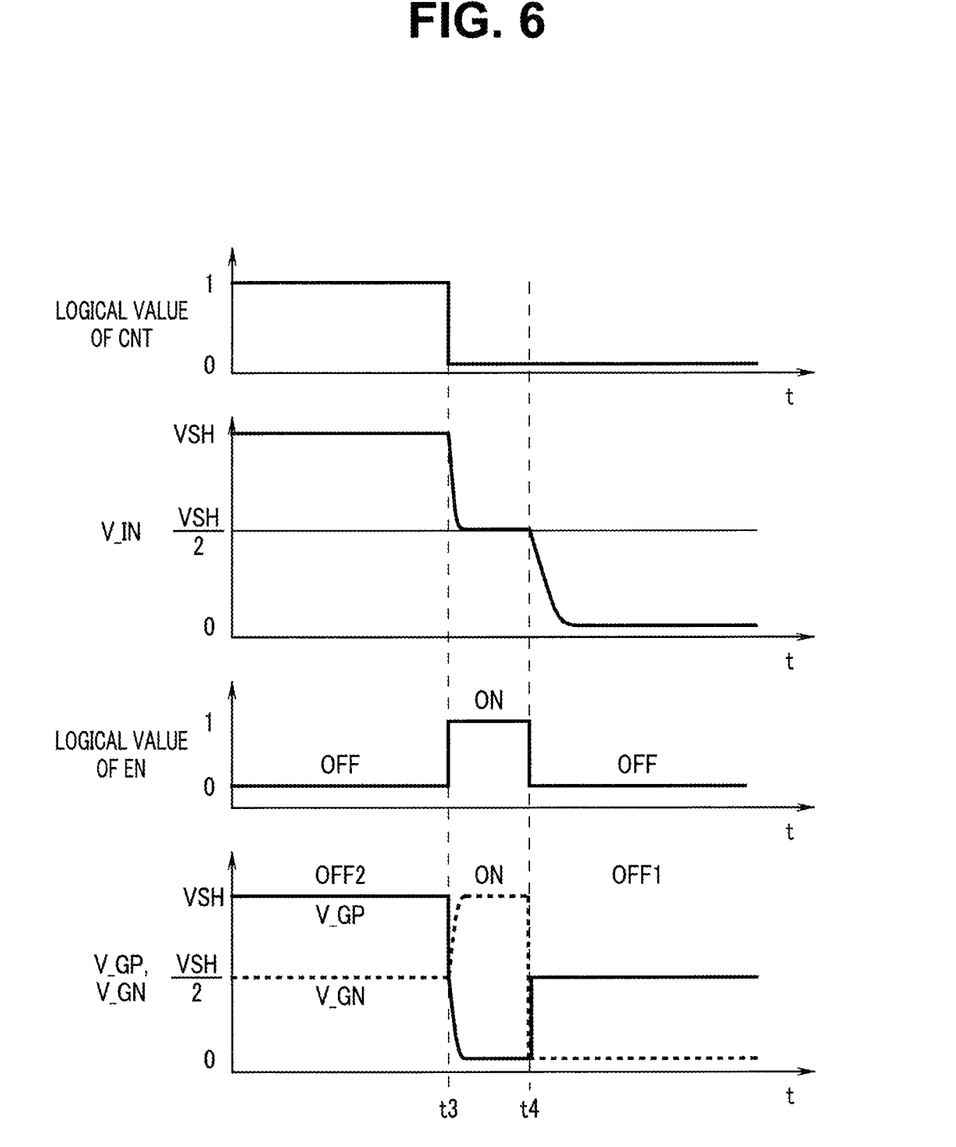
FIG. 6 is a timing chart showing a second operation example of the analog switch circuit according to the first embodiment.
Figure 7:
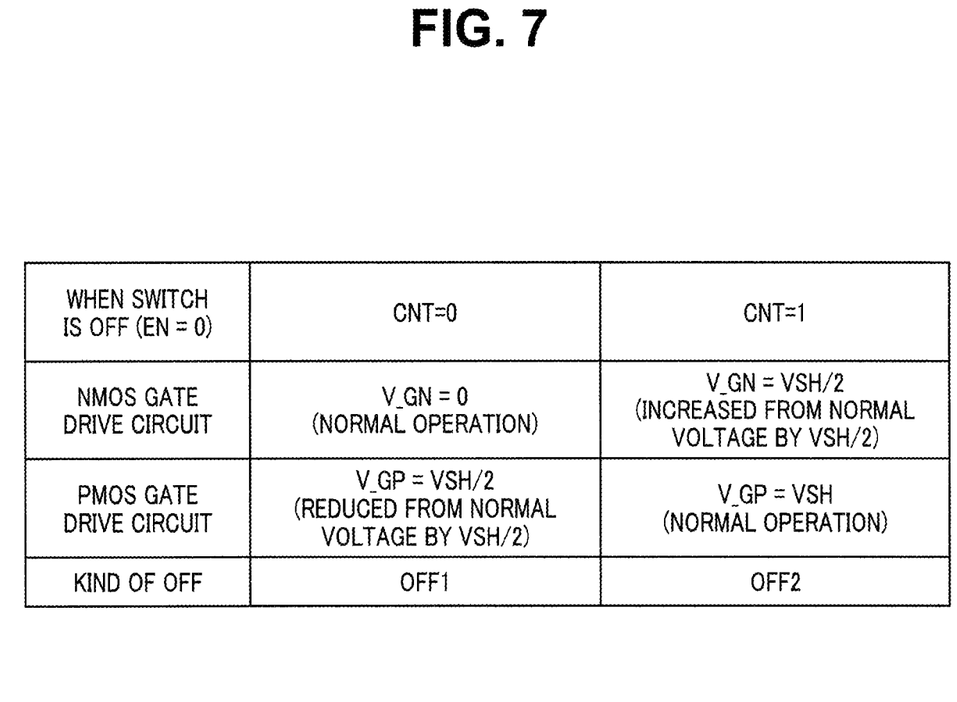
FIG. 7 is a table for describing operations of an NMOS gate drive circuit and a PMOS gate drive circuit of the analog switch circuit according to the first embodiment.
Figure 8:
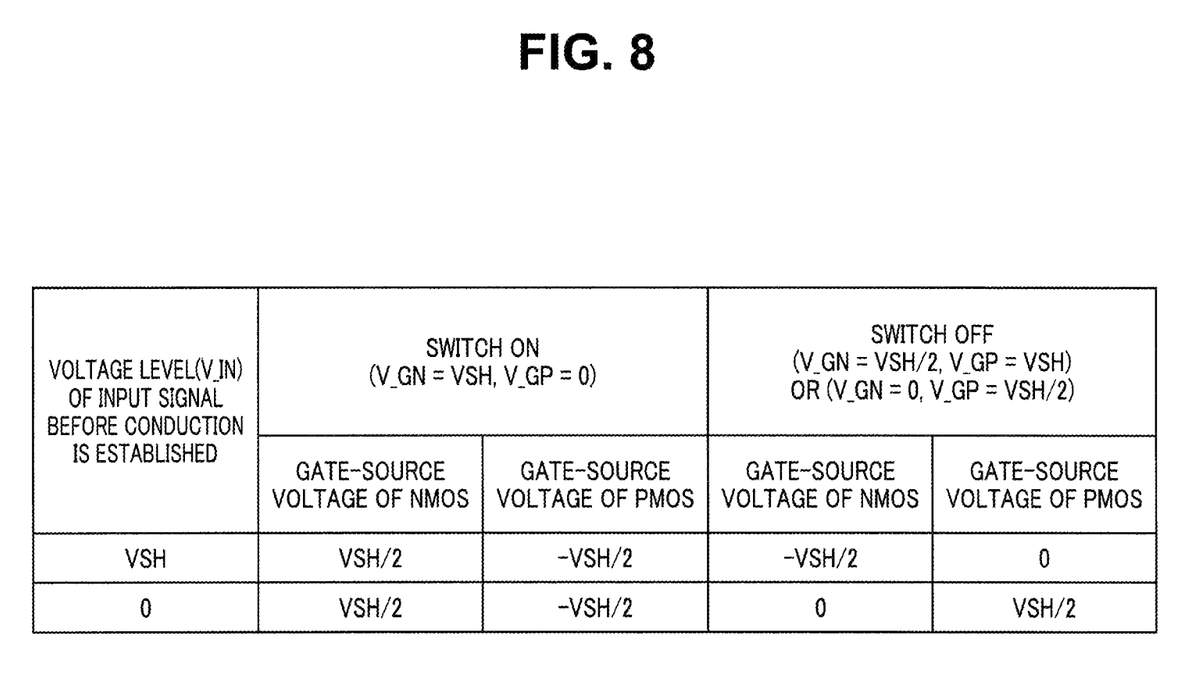
FIG. 8 is a table showing examples of gate-source voltages in the analog switch circuit according to the first embodiment.

The operation of the analog switch circuit 1 will be described with reference to FIG. 5 to FIG. 8. FIG. 5 is a timing chart showing a first operation example of the analog switch circuit 1 according to the first embodiment. FIG. 6 is a timing chart showing a second operation example of the analog switch circuit 1 according to the first embodiment. FIG. 7 is a table for describing the operations of the NMOS gate drive circuit 11 and the PMOS gate drive circuit 12 of the analog switch circuit 1 according to the first embodiment. FIG. 8 is a table showing examples of the gate-source voltages in the analog switch circuit 1 according to the first embodiment.

In the first operation example shown in FIG. 5, the logical value of the control signal CNT changes from "0" to "1" at a time point t1.

In a case where the logical value of the control signal CNT is "0", when the analog switch 10 is OFF, the analog signal output circuit 30 outputs an input signal IN of voltage V_IN=0.

In a case where the control signal CNT is 0 and the enable signal EN is 0 (in the case of OFF1), as shown in a column for "CNT=0" in FIG. 7, the NMOS gate drive circuit 11 outputs a gate drive signal GN of voltage V_GN=0 (normal operation), and the PMOS gate drive circuit 12 outputs a gate drive signal GP of voltage V_GP=(VSH/2). The voltage V_GP=(VSH/2) of the gate drive signal GP outputted from the PMOS gate drive circuit 12 is a voltage lower than the normal voltage VSH by an amount of (VSH/2).

At this point of operation, the voltage V_IN is 0 and hence, the gate-source voltage of the NMOS 10n is 0, and the gate-source voltage of the PMOS 10p is (VSH/2) (see a column for "V_IN=0" and "switch off" in FIG. 8).

At the time point t1, the control signal CNT changes from 0 to 1 and the enable signal EN changes from 0 to 1. In a case where the enable signal EN is 1, irrespective of the logical value of the control signal CNT, the NMOS gate drive circuit 11 outputs a gate drive signal GN of voltage V_GN=VSH (normal operation), and the PMOS gate drive circuit 12 outputs a gate drive signal GP of voltage V_GP=0 (normal operation). With such operations, the analog switch 10 is turned on, so that the input terminal 10a and the output terminal 10b become conductive and the potential of the input terminal 10a becomes (VSH/2) (see V_IN of the timing chart in FIG. 5).

As shown in a column for "switch on" in FIG. 8, the gate-source voltage of the NMOS 10n and the gate-source voltage of the PMOS 10p when the analog switch 10 is ON are substantially equal to the gate-source voltages shown in the column for "switch on" of the comparison example in FIG. 2. In other words, the gate-source voltage of the NMOS 10n is (VSH/2), and the gate-source voltage of the PMOS 10p is (−VSH/2).

In a state where the control signal CNT remains 1, the enable signal EN changes from 1 to 0 at a time point t2 which is later than the time point t1.

In a case where the logical value of the control signal CNT is "1", when the analog switch 10 is OFF, the analog signal output circuit 30 outputs an input signal IN of voltage V_IN=VSH.

In a case where the control signal CNT is 1 and the enable signal EN is 0 (in the case of OFF2), as shown in a column for "CNT=1" in FIG. 7, the NMOS gate drive circuit 11 outputs a gate drive signal GN of voltage V_GN=(VSH/2), and the PMOS gate drive circuit 12 outputs a gate drive signal GP of voltage V_GP=VSH (normal operation). The Voltage V_GN=(VSH/2) of the gate drive signal GN outputted from the NMOS gate drive circuit 11 is a voltage higher than the normal voltage 0 by an amount of (VSH/2).

At this point of operation, the voltage V_IN is VSH and hence, the gate-source voltage of the NMOS 10n is (−VSH/2), and the gate-source voltage of the PMOS 10p is 0 (see a column for "V_IN=VSH" and "switch off" in FIG. 8).

Accordingly, as shown in FIG. 8, in any of the case where the analog switch 10 is ON, the case where the analog switch 10 is OFF1, or the case where the analog switch 10 is OFF2, the absolute value of the gate-source voltage of the NMOS 10n and the absolute value of the gate-source voltage of the PMOS 10p remain at equal to or lower than the gate withstand voltage VGT.

In the second operation example shown in FIG. 6, the logical value of the control signal CNT changes from "1" to "0" at a time point t3. Further, the logical value of the enable signal EN changes from "0" to "1" at the time point t3, and changes from "1" to "0" at a time point t4 which is later than the time point 3.

Also in the second operation example, in the same manner as the first operation example shown in FIG. 5, the NMOS gate drive circuit 11 and the PMOS gate drive circuit 12 perform the operation for OFF2 when CNT is 1 and EN is 0. The NMOS gate drive circuit 11 and the PMOS gate drive circuit 12 perform an ON operation irrespective of the logical value of CNT when EN is 0. The NMOS gate drive circuit 11 and the PMOS gate drive circuit 12 perform the operation for OFF1 when CNT is 0 and EN is 0.

Figure 9:
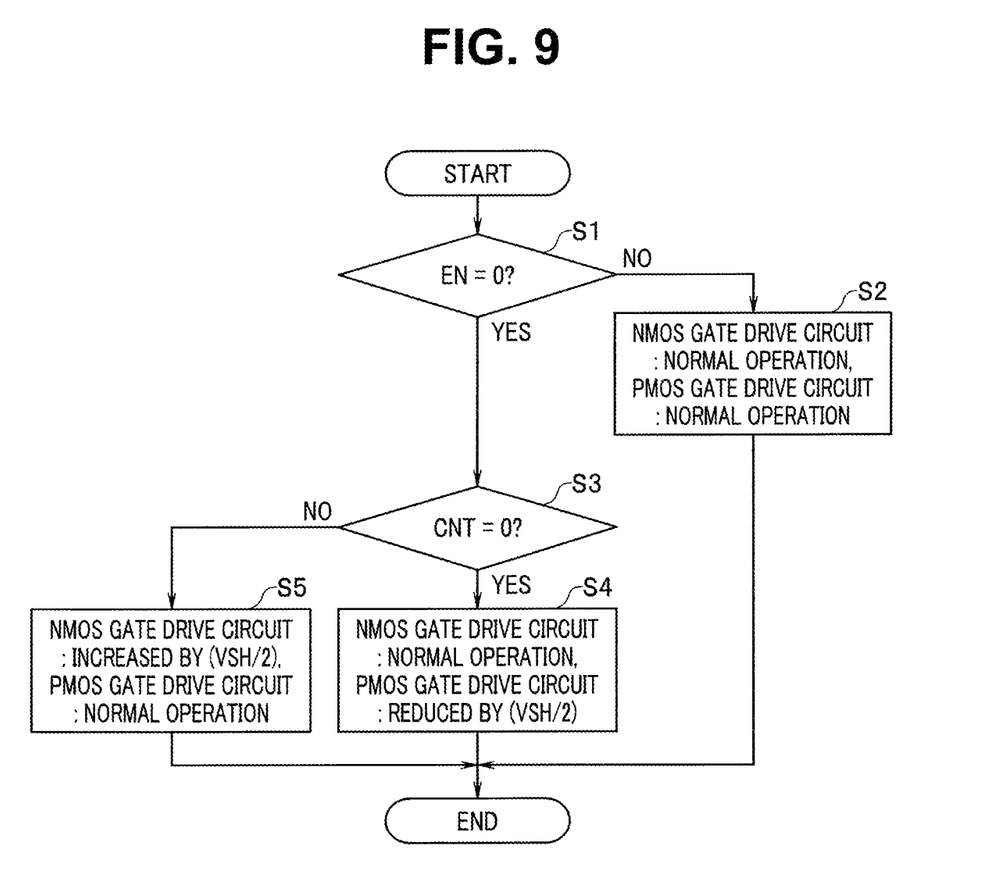
FIG. 9 is a flowchart showing the manner of operation of the analog switch circuit according to the first embodiment.

FIG. 9 is a flowchart showing the manner of operation of the analog switch circuit 1 according to the first embodiment.

When the process starts, the analog switch circuit 1 branches the process according to whether the enable signal EN is 0 (step S1).

When the enable signal EN is 1, the NMOS gate drive circuit 11 and the PMOS gate drive circuit 12 of the analog switch circuit 1 perform a normal operation of turning on the analog switch circuit 1 (step S2).

When the enable signal EN is 0 in step S1, the analog switch circuit 1 branches the process according to whether a control signal CNT is 0 (step S3).

When the control signal CNT is 0, the NMOS gate drive circuit 11 of the analog switch circuit 1 performs the normal operation, thus setting V_GN to 0, and the PMOS gate drive circuit 12 sets V_GP to (VSH/2) by reducing the voltage from the normal voltage VSH by an amount of (VSH/2) (step S4).

In contrast, when the control signal CNT is 1 in step S3, the NMOS gate drive circuit 11 of the analog switch circuit 1 sets V_GN to (VSH/2) by increasing the voltage from the normal voltage 0 by an amount of (VSH/2), and the PMOS gate drive circuit 12 performs the normal operation, thus setting V_GP to VSH (step S5).

After processing in step S2, S4, or S5 is performed, the analog switch circuit 1 ends the process shown in FIG. 9.

Figure 10:
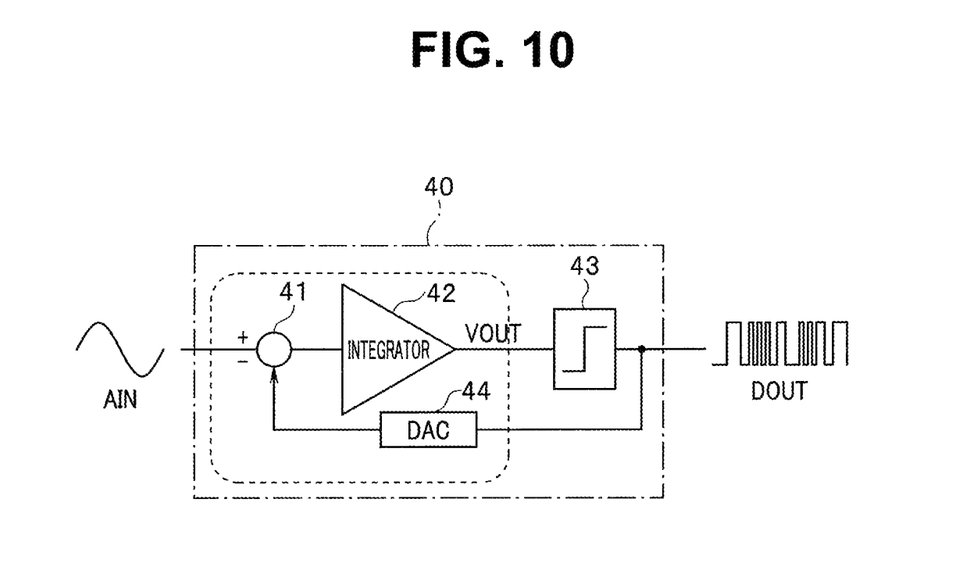
FIG. 10 is a diagram showing a ΔΣ modulator as one example of a circuit to which the analog switch circuit according to the first embodiment is applied.

FIG. 10 is a diagram showing a ΔΣ modulator 40 as one example of a circuit to which the analog switch circuit 1 according to the first embodiment is applied.

The ΔΣ modulator 40 is an analog/digital converter that receives an input of an analog signal AIN, generates a digital signal DOUT by performing processing on the analog signal AIN, and outputs the digital signal DOUT. The ΔΣ modulator 40 includes a differentiator 41, an integrator 42, a comparator 43, and a digital/analog converter (DAC) 44.

The analog signal AIN is inputted to the differentiator 41, and an analog signal from the DAC 44 is subtracted from the analog signal AIN. The differentiator 41 outputs the analog signal being subjected to subtraction to the integrator 42. The integrator 42 integrates the inputted analog signal, and outputs an analog signal VOUT. The comparator 43 compares the voltage of the analog signal VOUT with a predetermined voltage, and generates a digital signal DOUT of one bit by quantizing the analog signal VOUT based on the comparison result. The digital signal DOUT generated by the comparator 43 is outputted to the outside of the ΔΣ modulator 40, and is outputted to the DAC 44. The DAC 44 converts the digital signal DOUT inputted from the comparator 43 to an analog signal, and outputs the analog signal to the differentiator 41.

Figure 11:
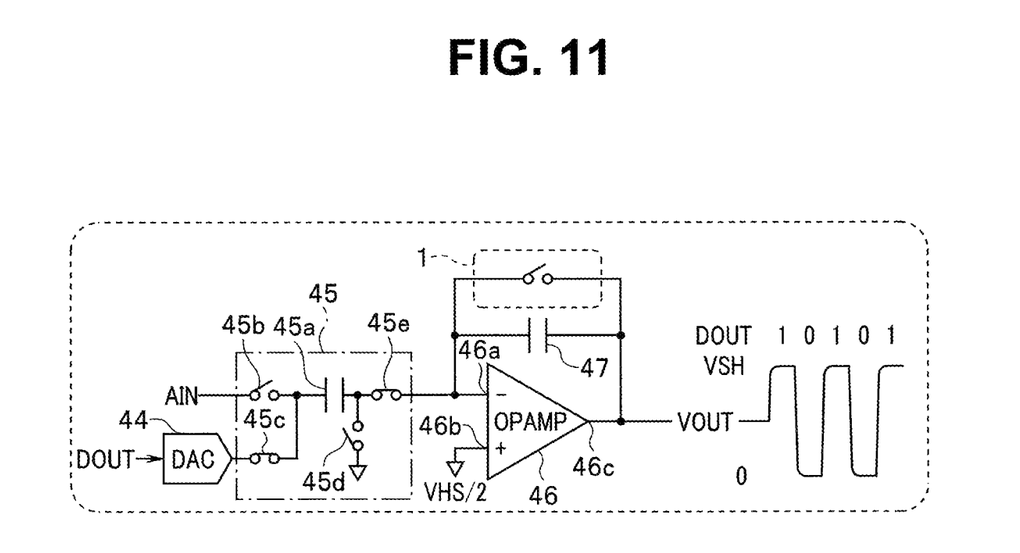
FIG. 11 is a diagram showing an example of a circuit configuration of a differentiator and an integrator of the ΔΣ modulator according to the first embodiment.

FIG. 11 is a diagram showing an example of a circuit configuration of the differentiator 41 and the integrator 42 of the ΔΣ modulator 40 according to the first embodiment. FIG. 11 shows the example of the circuit configuration of a portion surrounded by a dotted line in FIG. 10.

The differentiator 41 and the integrator 42 include, for example, a switched-capacitor (SC) circuit 45, an operational amplifier 46, a capacitor 47, and the analog switch circuit 1.

The SC circuit 45 includes a capacitor 45a, a switch 45b, a switch 45c, a switch 45d, and a switch 45e. The switch 45b, the capacitor 45a, and the switch 45e are connected in series in this order. The switch 45c is connected between the switch 45b and the capacitor 45a, and the switch 45d is connected between the capacitor 45a and the switch 45e. The analog signal AIN is inputted to the switch 45b. The switch 45c is connected to the DAC 44. The switch 45d is connected to a power supply 20A (see FIG. 12). The switch 45e is connected to an inversion input terminal 46a of the operational amplifier 46.

A non-inversion input terminal 46b of the operational amplifier 46 is connected to the power supply 20A (see FIG. 12) at voltage (VSH/2). Accordingly, the voltage of the inversion input terminal 46a that is virtually short-circuited to the non-inversion input terminal 46b is (VSH/2).

The capacitor 47 is provided on the feedback path of the operational amplifier 46, that is, connected between an output terminal 46c and the inversion input terminal 46a. The analog switch circuit 1 is connected to both ends of the capacitor 47. In this configuration, the integrator 42 is an inverting analog integrator that is formed as an SC integrator, and inverts and integrates a signal inputted from the inversion input terminal 46a.

The SC circuit 45 performs a crawl operation and hence, when the switch 45b and the switch 45d are turned on and the switch 45c and the switch 45e are turned off, the analog signal AIN is connected to the capacitor 45a.

When the switch 45b and the switch 45d are turned off and the switch 45c and the switch 45e are turned on, the DAC 44 is connected to the capacitor 45a. At this point of operation, an inverted integrated signal from the integrator 42 is inputted to the capacitor 45a via the comparator 43 and the DAC 44. Therefore, when the DAC 44 is connected to the capacitor 45a, the differentiator 41 is operated.

When the analog switch circuit 1, which is connected to both ends of the capacitor 47, is turned off, the capacitor 47 can be charged. When the analog switch circuit 1 is turned on, the capacitor 47 is discharged.

The analog signal VOUT outputted from the output terminal 46c of the operational amplifier 46 becomes a pulse wave that changes between voltage 0 and voltage VSH, and the pulse wave is inputted to the comparator 43.

The comparator 43 compares the voltage of the analog signal VOUT with a predetermined voltage, for example, (VSH/2). When the voltage of the analog signal VOUT is equal to or higher than (VSH/2), the comparator 43 outputs a logical value "1". When the voltage of the analog signal VOUT is lower than (VSH/2), the comparator 43 outputs a logical value "0". Accordingly, it is possible to determine whether the voltage of the analog signal VOUT is VSH or 0 based on whether the logical value of the digital signal DOUT is 1 or 0.

Figure 12:
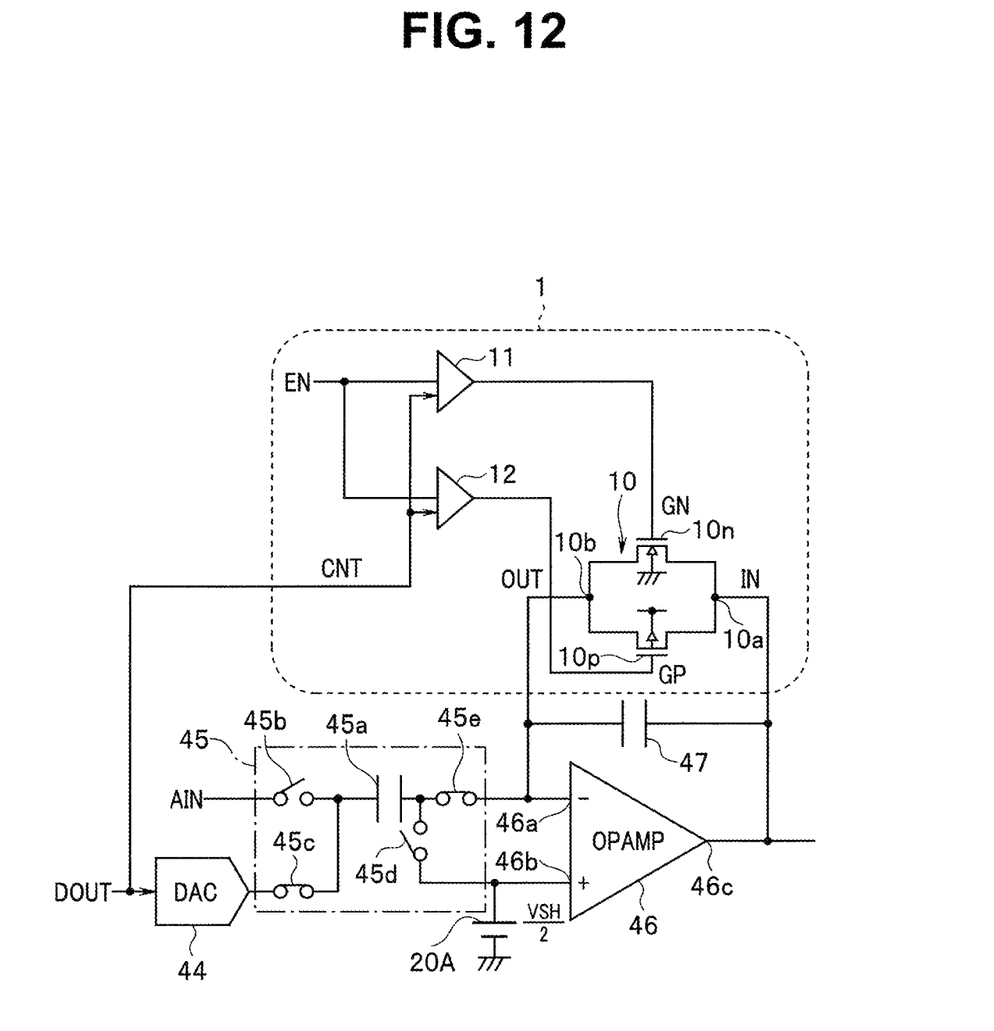
FIG. 12 is a diagram showing a constitutional example where the analog switch circuit is applied to the ΔΣ modulator according to the first embodiment.

As described above, the digital signal DOUT outputted from the comparator 43 is outputted to the outside of the ΔΣ modulator 40 and to the DAC 44, and is further outputted to the analog switch circuit 1 as a control signal CNT (see FIG. 12).

FIG. 12 is a diagram showing a constitutional example where the analog switch circuit 1 is applied to the ΔΣ modulator 40 according to the first embodiment.

The DAC 44, the SC circuit 45, the operational amplifier 46, and the capacitor 47 correspond to the analog signal output circuit 30 shown in FIG. 3.

The output terminal 10b of the analog switch 10 is connected to the inversion input terminal 46a, which is virtually short-circuited to the non-inversion input terminal 46b. Accordingly, the potential of the output terminal 10b remains (VSH/2) as described above.

The input terminal 10a of the analog switch 10 is connected to the output terminal 46c of the operational amplifier 46. Accordingly, an analog signal VOUT that changes between voltage 0 and voltage VSH is inputted to the input terminal 10a as an input signal IN.

The analog switch circuit 1 is operated as described above in response to the enable signal EN and the control signal CNT. In other words, when the analog switch 10 is OFF, the voltage of an analog signal VOUT inputted to the input terminal 10a of the analog switch 10 from the operational amplifier 46 is determined based on a digital signal DOUT (that is, the control signal CNT) fed back to the DAC 44, and the NMOS gate drive circuit 11 and the PMOS gate drive circuit 12 control the voltage of the gate drive signal GN and the voltage of the gate drive signal GP. With such a configuration, even when the switch is OFF, the absolute value of the gate-source voltage of the analog switch circuit 1 can remain at equal to or lower than the gate withstand voltage VGT. As described above, the absolute value of the gate-source voltage of the analog switch circuit 1 remains at equal to or lower than the gate withstand voltage VGT when the switch is ON.

In the first embodiment, the voltages of the gate drive signals GN, GP when the switch is OFF are controlled in response to the control signal CNT. Accordingly, even in the case where the gate drive signal GN, GP of voltage higher than the gate withstand voltage VGT is outputted to the gate terminal (G) of the analog switch 10 when the switch is ON, there is no possibility that the absolute value of the gate-source voltage exceeds the gate withstand voltage VGT irrespective of whether the analog switch 10 is ON or OFF.

Accordingly, there is no possibility that a transistor forming the analog switch 10 is broken and reliability is lowered. Further, the analog switch circuit 1 can be formed by using a transistor having a normal gate withstand voltage and hence, it is possible to manufacture the analog switch circuit 1 at a low cost.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. An analog switch circuit comprising:
   an analog switch including an N-type MOSFET and a P-type MOSFET each having a gate operating withstand voltage of VGT, a source terminal of the N-type MOSFET and a source terminal of the P-type MOSFET being connected with each other, a drain terminal of the N-type MOSFET and a drain terminal of the P-type MOSFET being connected with each other, the N-type MOSFET and the P-type MOSFET being arranged in parallel, each of a potential of the drain terminal of the N-type MOSFET and a potential of the drain terminal of the P-type MOSFET being (VSH/2) when VSH is a voltage higher than VGT and equal to or lower than (2×VGT);

a first gate drive circuit to which an enable signal and a control signal are inputted, the first gate drive circuit being connected to a gate terminal of the N-type MOSFET of the analog switch; and a second gate drive circuit to which the enable signal and the control signal are inputted, the second gate drive circuit being connected to a gate terminal of the P-type MOSFET of the analog switch, wherein in a case where a logical value of the enable signal is 0, a voltage 0 or a voltage VSH is applied to the source terminal of the N-type MOSFET of the analog switch and to the source terminal of the P-type MOSFET of the analog switch according to whether a logical value of the control signal is 0 or 1, when the logical value of the control signal is 0, the first gate drive circuit outputs a signal of voltage 0 to the gate terminal of the N-type MOSFET, and the second gate drive circuit outputs a signal of voltage (VSH/2) to the gate terminal of the P-type MOSFET, and when the logical value of the control signal is 1, the first gate drive circuit outputs a signal of voltage (VSH/2) to the gate terminal of the N-type MOSFET, and the second gate drive circuit outputs a signal of voltage VSH to the gate terminal of the P-type MOSFET.

2. The analog switch circuit according to claim 1, wherein in a case where the logical value of the enable signal is 1, irrespective of the logical value of the control signal, the first gate drive circuit outputs a signal of voltage VSH to the gate terminal of the N-type MOSFET, and the second gate drive circuit outputs a signal of voltage 0 to the gate terminal of the P-type MOSFET, and the source terminal of the N-type MOSFET of the analog switch becomes conductive with the drain terminal of the N-type MOSFET, so that a potential of the source terminal of the N-type MOSFET becomes (VSH/2), and the source terminal of the P-type MOSFET of the analog switch becomes conductive with the drain terminal of the P-type MOSFET, so that a potential of the source terminal of the P-type MOSFET becomes (VSH/2).

3. The analog switch circuit according to claim 1, further comprising an analog signal output circuit to which the control signal is inputted, the analog signal output circuit being configured to output a signal of voltage 0 or voltage VSH to the source terminal of the N-type MOSFET of the analog switch and to the source terminal of the P-type MOSFET of the analog switch according to whether the logical value of the control signal is 0 or 1.

4. The analog switch circuit according to claim 1, wherein
a back gate operating withstand voltage of each of the N-type MOSFET and the P-type MOSFET of the analog switch is equal to or higher than the voltage VSH.

* * * * *